US005767464A

United States Patent [19]

Dyer et al.

[11] Patent Number: 5,767,464

[45] Date of Patent: Jun. 16, 1998

[54] ELECTRONIC DEVICE LOW PROFILE KEYBOARD SWITCH ASSEMBLY WITH DEPLOYED AND STORED ACTUATING MECHANISM

[75] Inventors: Terill D. Dyer, Dallas; Satwinder D. S. Malhi, Garland, both of Tex.

[73] Assignee: Texas Instruments Incorporated, Dallas, Tex.

[21] Appl. No.: 761,622

[22] Filed: Dec. 5, 1996

[51] Int. Cl.$^6$ .............................. H01H 9/00; H05K 5/00; B41J 5/00; G06C 7/00

[52] U.S. Cl. .......................... 202/5 A; 200/344; 361/380; 345/168

[58] Field of Search .................................... 200/5 A, 341, 200/344, 345; 361/680; 345/168

[56] References Cited

U.S. PATENT DOCUMENTS

| | | | |
|---|---|---|---|
| 4,580,022 | 4/1986 | Oelsch et al. | 200/340 |
| 4,902,862 | 2/1990 | Oelsch et al. | 200/344 |
| 5,382,762 | 1/1995 | Mochizuki | 200/5 A |
| 5,399,822 | 3/1995 | Sato et al. | 200/344 |
| 5,463,195 | 10/1995 | Watanabe et al. | 200/5 A |
| 5,519,569 | 5/1996 | Sellers | 360/380 |
| 5,532,904 | 7/1996 | Sellers | 200/344 X |
| 5,587,875 | 12/1996 | Sellers | 200/344 X |
| 5,590,020 | 12/1996 | Sellers | 361/380 |
| 5,594,618 | 1/1997 | Sellers | 200/6 A X |
| 5,602,715 | 2/1997 | Lempicki et al. | 200/5 A X |
| 5,625,532 | 4/1997 | Sellers | 200/344 X |
| 5,654,872 | 8/1997 | Sellers | 200/344 X |

*Primary Examiner*—J. R. Scott
*Attorney, Agent, or Firm*—Bret J. Petersen; James C. Kesterson; Richard L. Donaldson

[57] ABSTRACT

A low profile keyboard which can be deployed from a storage position and once deployed have the feel and travel of prior art keyboards using scissor type wobble control. An embodiment of the invention reduces the storage thickness in prior art designs by translating the flexible dome to a position under the keycap when in the stowed position and back to beneath the actuator mechanism when in the deployed position. Thus in the deployed position the space for the key travel and the dome does not contribute to the overall thickness of the keyboard.

10 Claims, 6 Drawing Sheets

ELECTRONIC DEVICE LOW PROFILE KEYBOARD SWITCH ASSEMBLY WITH DEPLOYED AND STORED ACTUATING MECHANISM

CROSS-REFERENCE TO RELATED APPLICATIONS

The following coassigned patent applications are incorporated herein by reference:

| Number | Filing Date | Title |
|---|---|---|
| 08/594,547 | 01/31/96 | Reduced Layer Keyboard |
| 08/627,258 | 04/03/96 | A Low Profile, Lightweight Keyboard |
| 08/ | 05/30/96 | A Low Profile Keyboard |
| 08/ | 12/10/96 | A Low Profile Keyboard |

FIELD OF THE INVENTION

This invention relates to keyboards and keyswitches, and more particularly, to a low profile keyboard which may be used in portable electronic devices such as laptops, notebooks, subnotebooks and pen computers, and other electronic machines that require keyboards. The keyswitch achieves a lower storage profile by laterally translating the key dome from under the actuating structure to a position under the keycap during keyboard storage.

BACKGROUND OF THE INVENTION

Keyboards or keyswitches are found on nearly every electronic device. Of particular interest herein are keyboards on portable electronic devices such as portable personal computers. Portable personal computers have developed from early luggable "suit case" designs, through the smaller "laptop" design, and now, with the aid of increasingly smaller packaging to "notebook," "sub-notebook" and personal digital assistants (PDAs) such as pen computers.

A "notebook" personal computer is about the size of a conventional loose leaf binder holding letter size paper, and typically weighs about 4–8 pounds. PDAs typically are too small to incorporate a keyboard and therefore often use a pen as the main interface for input. PDAs may weigh less than one pound to about 3 pounds with a screen size of about 5 by 7 inches or smaller. Those portable computers having size, weight and performance lying between the notebook and PDA are typically referred to as subnotebooks. In almost all portable notebook computer models, a keyboard compartment is hinged to a display screen compartment in such a manner that it is possible to fold the display screen compartment down against the keyboard compartment and to latch the two together. PDAs typically are a single enclosure with a screen on the top surface.

A significant portion of the thickness and weight of notebook and sub-notebook computers is the keyboard. Low profile switches are sought to reduce the height and weight of keyboards in portable personal computers. Additionally, it is important to users that the keyboard allow typing at a high speed. Two factors are very important to most users: (1) the depth of a keystroke and (2) the feel of the key including the tactile response once the keystroke is complete.

Making keyboards thinner has often involved reducing the depth of the keystroke. Reducing the depth of the keystroke under three millimeters, however, is unacceptable to many users. A keystroke of four millimeters is favored by most users, particularly touch typists, because it is similar in feel to a desktop computer keyboard. Accordingly, notebook computers which reduce height by reducing the depth of a keystroke are likely to be disfavored by many touch typists.

U.S. Pat. Nos. 5,280,147, 5,278,372, 5,463,195, all incorporated herein by reference, disclose prior art keyswitches having a similar design to a preferred embodiment herein. These keyswitches use a scissor mechanism for antiwobble control with a center actuation mechanism to collapse a flexible dome which provides key return and actuation of electrical contacts.

FIG. 1 shows a prior art keyswitch similar to the above cited patents which is available on the market in notebook computers from the assignee of those patents. This switch uses the scissor mechanism with a simplified keybase. The base has the electrical contacts for each key formed on the surface and stamped metal eyelets for retaining the scissor mechanism.

SUMMARY OF THE INVENTION

This invention provides a thinner keyboard without sacrificing the functionality for portable electronic devices, such as notebook computers. In specific embodiments, the present invention provides a low profile keyboard which can be deployed from a storage mode and once deployed have the feel and travel of prior art keyboards while retaining excellent wobble control provided by scissor or other mechanisms. The invention reduces the storage thickness in prior art designs by translating the flexible dome to a position under the keycap when in the storage position and back to beneath the actuator mechanism when in the deployed mode. Thus the space for the key travel and the dome in the deployed position do not contribute to the overall thickness of the keyboard in the storage position. In the prior art, if the key were to be stored in the depressed mode, the rubber spring or flexible dome would be compressed while in the storage mode, resulting in a fatigue damaged spring or dome resulting in decreased operating life.

In an embodiment of the invention, a low profile keyboard keyswitch is described which has a key cap featuring channels underneath for slidably retaining the scissor members of the anitwoble mechanism as the key is depressed by the user. The lower base may be a stamped metal part with the electrical connections printed thereon or a rigid material with a flexible printed circuit. The two base layers are connected at each end of the keyboard by a dual living hinge separated with a small hinge member. The living hinges allow the translating the flexible domes from a storage mode under the keycap to a deployed mode under the scissor actuation member.

An advantage of the present invention is the space needed to allow the key to travel does not contribute to the stowed thickness of the keyboard. Therefore, using the present invention it would be possible to make a key having a travel of 3.5 mm while having a stowed thickness of about 4 mm or less.

An advantage of this embodiment is that the flexible dome of the keyswitch is not compressed during the storage mode thereby preventing the dome from failing prematurely.

In another embodiment, a low profile keyboard keyswitch is described which has a key cap connected to a singular base with a scissor type wobble control mechanism. The base layer has eyelets for slidably retaining the scissor members as the key is depressed by the user. The base is preferably a stamped metal part with the electrical connections printed thereon. On top of the base is a thin mylar sheet with a strip running under the keycap and the scissor mechanism. The flexible dome is attached to the mylar sheet. The mylar sheet moves the flexible dome with respect to the keycap, translating the flexible domes from a stowed position under the keycap to a deployed position under the scissor actuation member.

An advantage of this embodiment is that only a single stiff, base layer is needed, which reduces the total keyboard weight.

The present invention also advantageously combines light and low profile keys with traditional wobble control methods to provide a low cost, low profile keyboard with improved user feel and tactile feedback over prior art designs.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiments of the present invention are best understood by referring to FIGS. 1–7 of the drawings, like numerals being used for like and corresponding parts of the various drawings.

Figure 1:
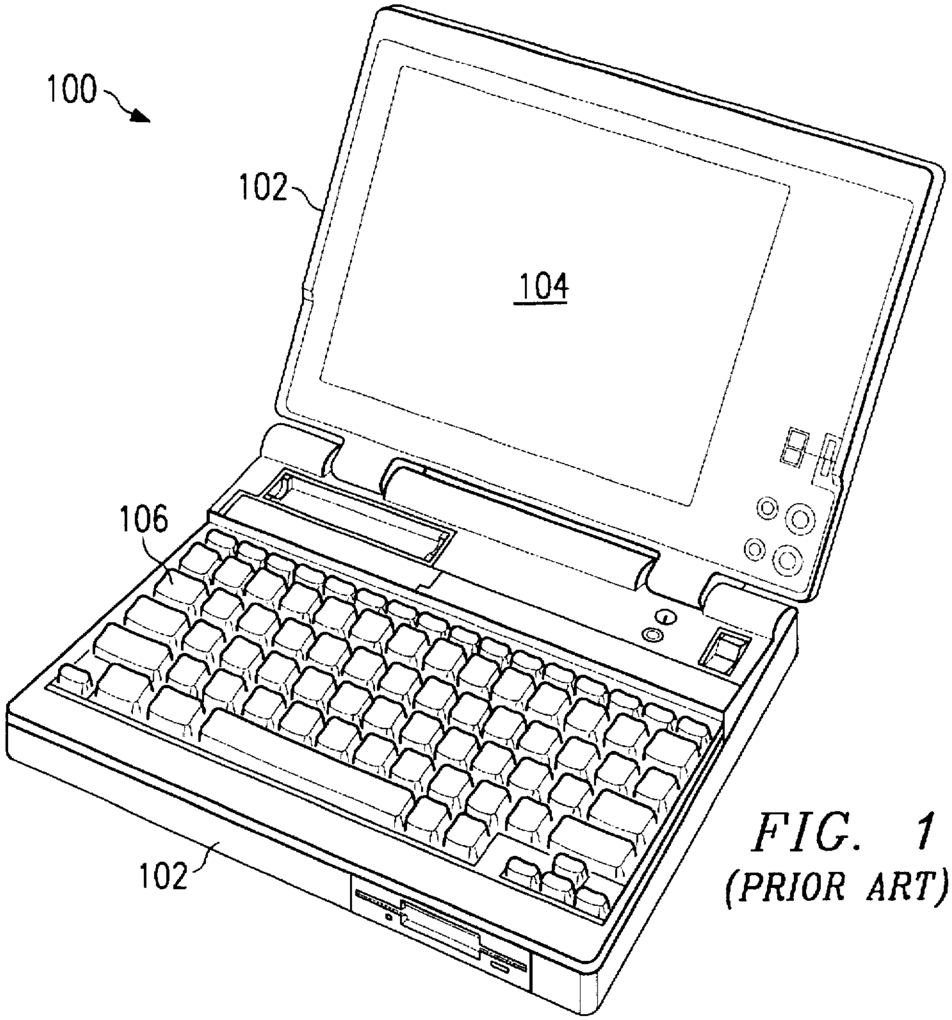
FIG. 1 (PRIOR ART)
FIG. 1 Represents a notebook computer of the prior art.

With reference to FIG. 1, there is shown a prior art portable computer 100 of the type commonly referred to as a notebook computer, or laptop computer. Computer 100 includes a housing 102 which is a clamshell type enclosure which includes a top and bottom housing. The top housing includes a screen 104, and the bottom housing has a keyboard 106. The two housings are connected along one edge with a hinge for pivotal movement relative to each other to expose the keyboard and display for use from the closed position. In order to reduce the overall thickness of the combined housings it is desirable to reduce the thickness of the keyboard and its associated housing.

Figure 2:
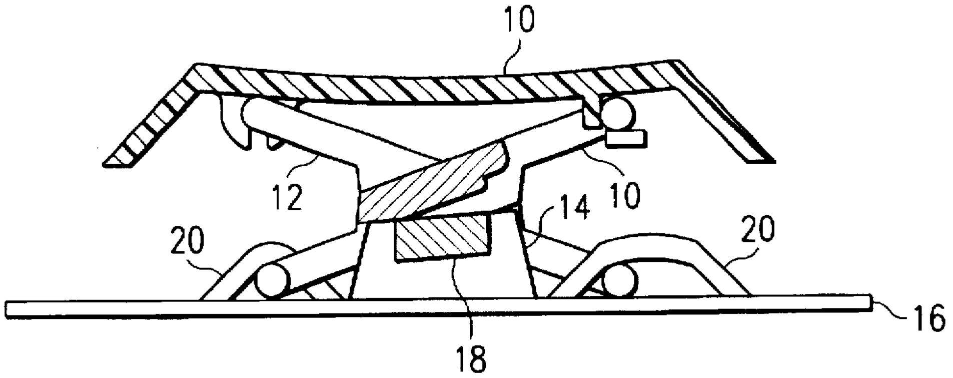
FIG. 2 (PRIOR ART)
FIG. 2 Represents a keyboard key of the prior art.

An example of a prior art keyboard key is illustrated in cross section in FIG. 2. This type of key comprises, a keytop 10, a guide mechanism 12, a flexible dome 14, and a base 16. The key top 10 is typically formed of a resin with an alphanumeric character stamped or formed on the top, and includes two pairs of engaging members or grooves to secure it to the guide mechanism 12. The guide mechanism is a scissor mechanism as described in the prior art patents cited above. The guide mechanism 12 presses a rubber spring or flexible dome 14 which has a moveable electrode 18 which makes contact with electrical traces on the base 16 when the key is depressed. The base 16 includes a means for retaining the guide mechanism such as the eyelets 20 as shown. Typically, one of the eyelets will hold one guide mechanism arm stationary, as shown on the left, and another eylet will slidably retain a second guide mechanism arm, as shown on the right of FIG. 2.

Figure 3A:
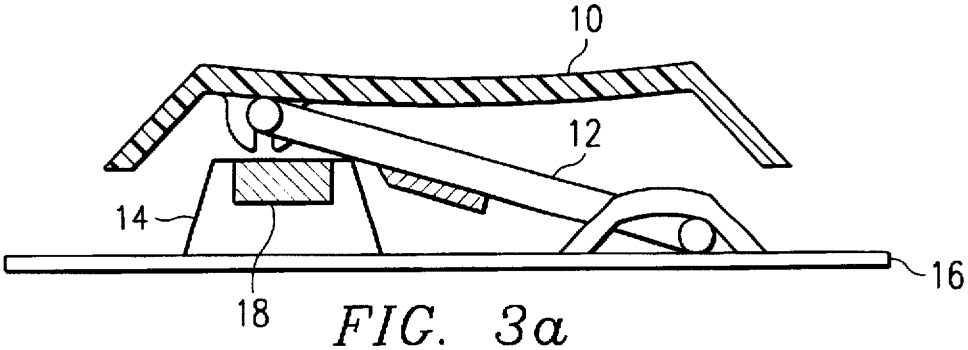
FIGS. 3*a–c* Represents cross-sectional views of a keyboard key of the present invention.
Figure 3B:
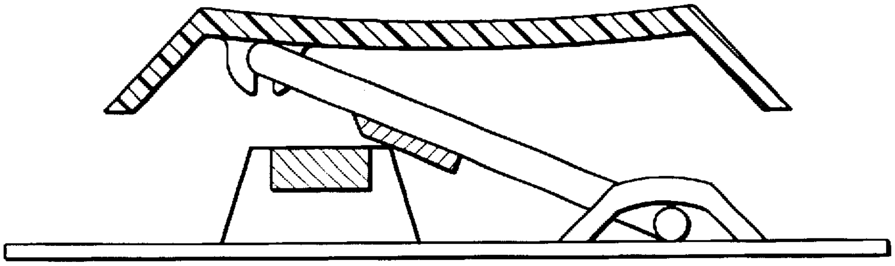
Figure 3C:
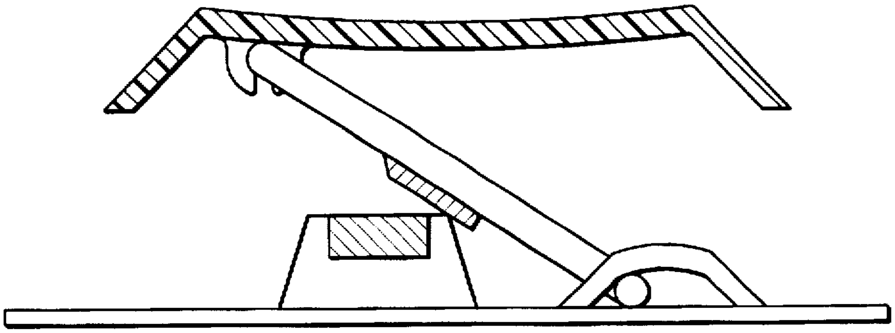

A first embodiment of the present invention is illustrated in FIGS. 3*a–c*. Referring to FIG. 3*a*, this embodiment comprises a low profile keyboard keyswitch according to the present invention. This keyswitch also has a key cap 10 a guide mechanism 12, and a flexible dome 14. The key top 10 preferably includes engaging members or grooves to secure it to the guide mechanism 12. The guide mechanism 12 presses a flexible dome 14 which has a moveable electrode 18 which makes contact with electrical traces on the base 16 when the key is depressed. FIG. 3*a* shows the key as the dome is stored under the keycap. FIG. 3*b* shows the key as the dome is laterally moved toward the deployed mode as shown in FIG. 3*c*.

The improvement over the prior art for the instant patent is primarily the ability to reduce the storage height of the key by amount of the key travel. In the prior art, if the key were to be stored in the depressed mode, the rubber spring or flexible dome would be compressed while in the storage mode, resulting in a damaged spring or dome. Also, it is more difficult to compress all the keys simultaneously when the flexible domes are in place. According to the present invention, the key can be more easily stored in a compressed mode without damage to the flexible dome from long term storage.

Figure 4A:
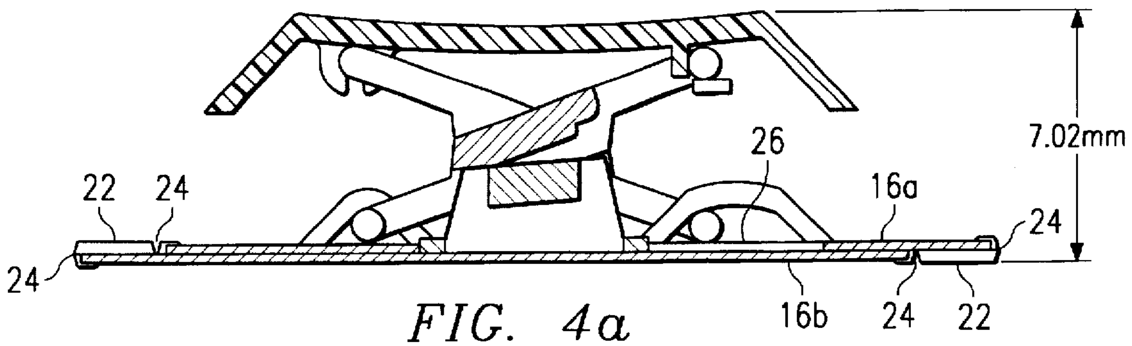
FIGS. 4*a–c* Represents cross-sectional views of a preferred embodiment of the present invention.
Figure 4B:
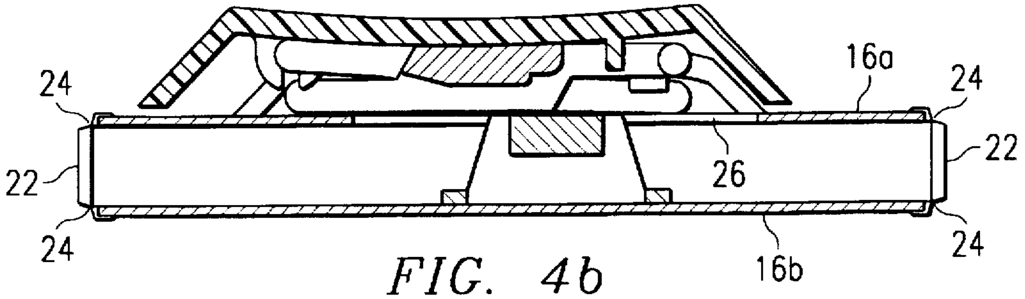
Figure 4C:
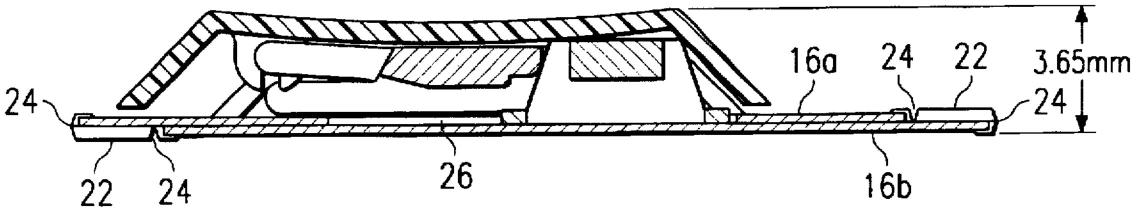

A more preferred embodiment of the present invention is illustrated in FIGS. 4*a–c*. Referring to FIG. 4*a*, this embodiment comprises a low profile keyboard keyswitch similar to the prior art keyswitch above. This improved keyswitch also has a key cap 10 a guide mechanism 12, and a flexible dome 14. The key top 10 is also typically formed of a resin with an alphanumeric character on the top, and preferably includes two pairs of engaging members or grooves to secure it to the guide mechanism 12. The guide mechanism is preferably but not necessarily a scissor mechanism as described above. The guide mechanism 12 presses a flexible dome 14 which has a moveable electrode 18 which makes contact with electrical traces on the base 16 when the key is depressed.

Again referring to FIG. 4*a*, the base of the present invention keyboard keyswitch includes an upper base 16*a*, a lower base 16*b*, base hinge members 22, and living hinges 24. The upper base 16*a* is preferably a stamped metal sheet which includes eyelets 20 for retaining the guide mechanism as discussed above. The lower base 16*b* may also be made of metal or some other suitable material such as a printed circuit board. The lower base also preferably includes electrical traces printed on the top surface which come in contact with an electrode 18 on the flexible dome 14 when the key is depressed. The flexible domes 14 are attached to the lower base using a suitable adhesive.

The upper and lower base layers are attached at either end of the keyswitch or either end of the entire keyboard with hinge members 22 preferable using living hinges 24. Thus each hinge member is attached to two living hinges, one of which is attached to the upper base and one attached to the lower base. The hinge members 22 may be made of any stiff material such as metal or plastic. The living hinge 24 is preferably made of a robust plastic which is thinned at the point of flex and can withstand repeated movement without fatigue. The width of the hinge members is chosen to provide displacement of the flexible dome to the storage mode as discussed below.

FIG. 4*b* illustrates the first embodiment of the present invention as the keyswitch is moved from the deployed mode shown in FIG. 4*a* to the storage mode shown in FIG. 4*c*. FIG. 4*b* shows the keyswitch after the upper base with the guide mechanism and keycap are lifted up and to the left from the mode shown in FIG. 4*a*. When the upper base is completely rotated to the left the keyswitch attains the storage mode as shown in FIG. 4*c*. In this mode, the flexible dome is latterly translated to a position away from the guide mechanism such that the dome is not deformed when the key is fully depressed. In a preferred embodiment, the flexible dome is stored under the keycap 10 adjacent the guide mechanism and between the keycap engaging members. The upper base 16*a* includes an opening 26 which is sufficiently wide to allow the flexible dome to protrude through the upper base in both the deployed and storage modes.

Figure 5A:
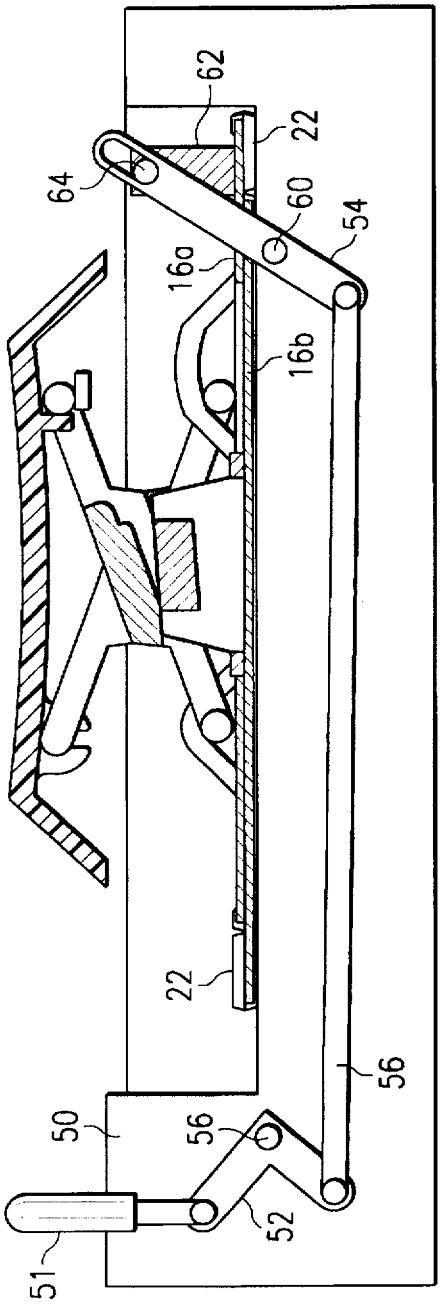
FIGS. 5*a–c* Represents cross-sectional views of a preferred embodiment of the present invention for implementing FIGS. 4*a–c*.
Figure 5B:
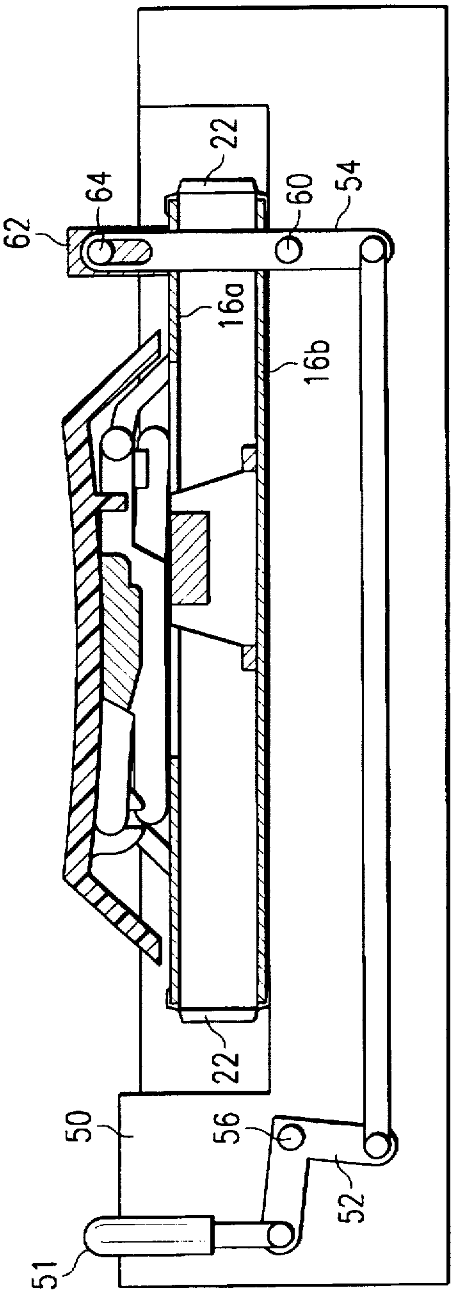
Figure 5C:
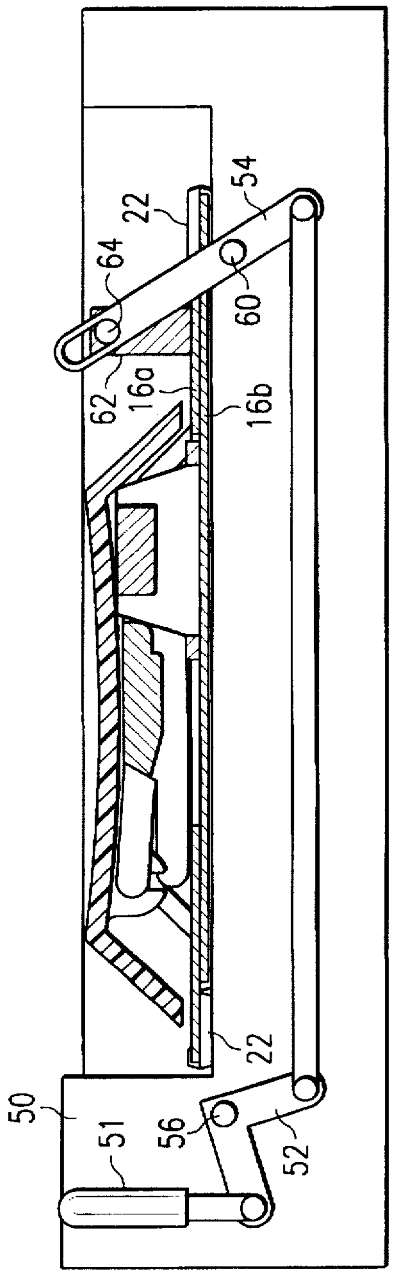

Movement of the upper base with respect to the lower base to transition the keys from a stowed mode to a deployed mode may be accomplished with a variety of methods. In one embodiment, the deployment is accomplished by a lever mechanism as illustrated in FIGS. 5*a*–*c*. FIG. 5*a* shows a cross-sectional view of a switch in the deployed position in the lower portion of a portable computer housing 50 (102 of the prior art computer of FIG. 1). Stowing the keyboard having one or more keyswitches may be accomplished by pushing a button 51 which moves a first lever 52 to push a second lever 54 with rod 56. Button 51 may be spring loaded and include means for holding the button in the depressed position. The first lever pivots about a point 58 while the second lever pivots about a point shown at 60. When the second lever pivots about point 60, the lever raises a mounting bracket 62. The mounting bracket 62 is connected to the upper base of the switch. Mounting bracket 62 has a pin 64 which slides in a slot of the mounting bracket as the bracket moves. FIG. 5*b* shows the switch in transition. The upper and lower base of the switch are pivoting about the hinge members 22 as the bracket 62 attached to the upper base 16*a* raises with the upper base 16*a* due to the lateral force applied to the bracket 62 from the second lever 54. The switch is shown in the completed storage position in FIG. 5*c*.

Figure 6B:
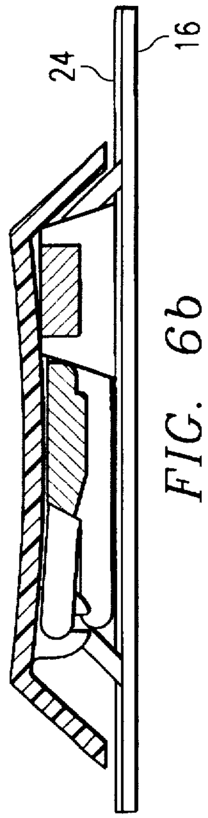
FIGS. 6*a–b* Represents a structure for laterally translating key domes with a carrier sheet for the preferred embodiment described in FIG. 4*a–c*.
Figure 6A:
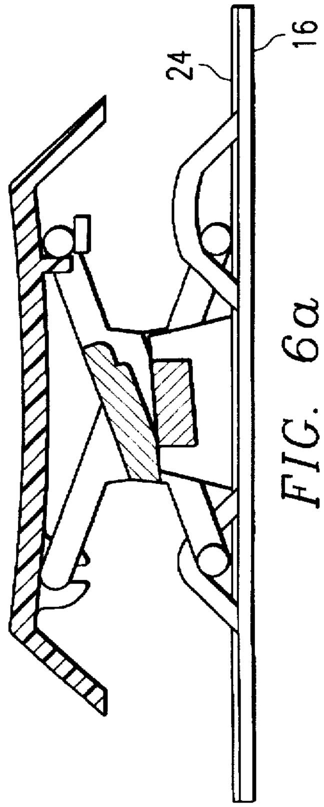

Another embodiment of the present invention is illustrated in FIGS. 6*a*–*b* which represent a cross section of the keyswitch. This embodiment also has a key cap 10 a guide mechanism 12, and a flexible dome 14. In this embodiment, the lateral translation of the flexible dome is accomplished with a single base layer 16 rather than the dual base layer of the previous embodiment. On top of the base layer 16 is a thin sheet of flexible material which is a carrier sheet 24 for the flexible domes. The carrier sheet 24 laterally translates the flexible dome 14 from the deployed mode shown in FIG. 5*a* to the storage mode shown in FIG. 6*b*.

Figure 7A:
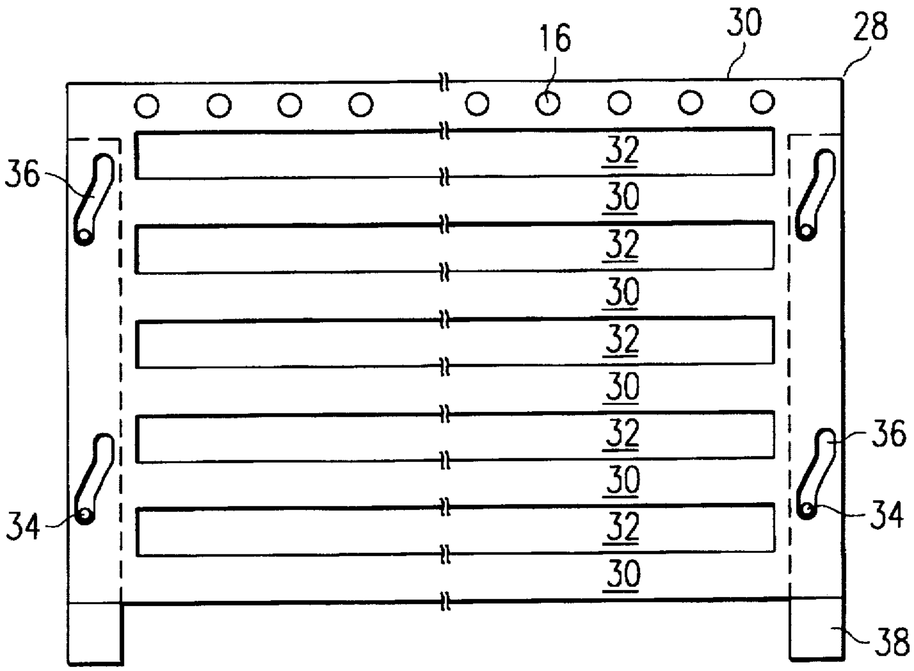
FIGS. 7*a–b* Represents a cross-sectional view of a preferred embodiment of the present invention for implementing FIGS. 6*a–b*.
Figure 7B:
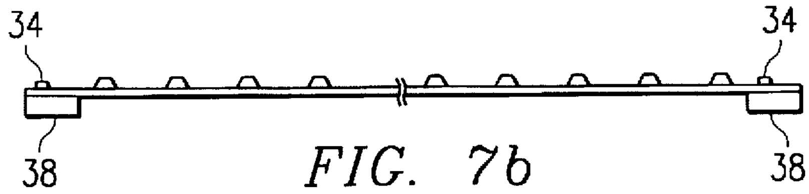

FIG. 7*a* illustrates a top plan view of a carrier sheet for a keyboard. The carrier sheet may be made of a thin flexible material such as mylar. The carrier sheet has an opening under the flexible dome to allow the electrode of the flexible dome to come in contact with electrical traces on the base layer when the key is depressed. The dome are preferably adhesively attached to the carrier sheet.

Movement of the domes on the carrier sheet to transition the keys from a stowed mode to a deployed mode may be accomplished with a variety of methods. In one embodiment, the domes are mounted to a carrier sheet which moves beneath the key guide mechanisms and above the base. FIG. 7*a* illustrates a plan view of a carrier sheet 28 which has strips of material 30 with domes 16 attached to the strips. On either side of the strips of the carrier sheet are openings 32 for the guide mechanisms to connect the key caps to the base as discussed above. Lateral translation of the carrier sheet with the attached domes may be accomplished by a slide mechanism as shown. Guide pins 34 attached to guide arms 38 slide in slots 36 of the carrier sheet. When the guide aims 38 with guide pins 34 are moved vertically the carrier sheet 28 with domes 16 are laterally translated.

It will be apparent to one skilled in the art that there are many variations that could be used for extending the keyboard into the deployed mode. Similarly, the key cell can be designed with different types of cone and alignment pin arrangements which are known by those skilled in the art and are contemplated by the present invention.

What is claimed is:

1. A portable electronic device comprising:

a. a housing;

b. a low profile keyboard associated with said housing comprising:

i) a plurality of keys having a guide mechanism;

ii) a base for said plurality of keys;

iii) electrical traces associated with said base layer; and iv) a flexible dome between said guide mechanism and said base for deforming when one of said keys is depressed to make contact with said electrical traces;

wherein said base comprises an upper and lower base layer, with the upper base layer being attached to the guide mechanism and the lower base layer associated with the electrical traces and the flexible domes; where the upper and lower base layers are connected to each other through hinge members which are connected with living hinges to the upper and lower base layers to allow the two base layers to move laterally with respect to each other; and wherein said dome is laterally translatable from between said guide mechanism and said base to a position under said keycap but not beneath said guide mechanism when said portable electronic device is in a storage mode.

2. The electronic device of claim 1, wherein said electrical traces are on a flexible circuit layer above said base layer.

3. The electronic device of claim 1, wherein said base layer is a stamped metal plate having a printed circuit with said electrical traces printed thereon.

4. The electronic device of claim 1, wherein said keyboard further comprises means for automatic deployment to allow the keyboard to automatically make the lateral translation of all the key domes.

5. A keyswitch comprising:

a) a plurality of key tops having engaging members;

b) an antiwobble guide mechanism having a first and second hinged member pivotally attached to one another to operate in a scissors like manner to guide said keytop and attached to said keytop engaging members;

c) a base layer having engaging members for engaging said guide mechanism;

d) electrical traces associated with said base layer; and e) a flexible dome between said guide mechanism and said base for contacting said electrical traces on said base when the key is depressed and deformed by said guide mechanism;

wherein said dome is laterally translatable from between said guide mechanism and said base to a position under said keycap but not beneath said guide mechanism when in the storage mode; and wherein said base comprises an upper and lower base layer, with the upper base layer being attached to the guide mechanism and the lower base layer associated with the electrical traces and the flexible domes; where the upper and lower base layers are connected to each other through hinge members which are connected with living hinges to the upper and lower base layers to allow the two base layers to move laterally with respect to each other thereby laterally translating the dome away from a position under the guide mechanism to an adjacent position.

6. The device of claim 5, wherein said electrical traces are on a flexible circuit layer above said base layer.

7. The device of claim 5, wherein said base layer is a stamped metal plate having a printed circuit with said electrical traces printed thereon.

8. The device of claim 5, wherein said keyboard further comprises means for automatic deployment to allow the keyboard to automatically make the lateral translation of all the key domes.

9. A method of reducing the height of a keyboard keyswitch comprising:

i) providing a plurality of key tops having engaging members;

ii) providing an antiwobble guide mechanism having a first and second hinged member pivotally attached to one another to operate in a scissors like manner to guide said keytop and attached to said keytop engaging members;

iii) providing a base layer having engaging members for engaging said guide mechanism;

iv) providing a flexible dome between said guide mechanism and said base for contacting said electrical traces on said base when the key is depressed and deformed by said guide mechanism;

v) laterally translating said flexible dome from between said guide mechanism and said base to a position under said keycap but not beneath said guide mechanism for a storage mode; wherein said base comprises an upper and lower base layer, with the upper base layer being attached to the guide mechanism and the lower base layer associated with the electrical traces and the flexible domes; where the upper and lower base layers are connected to each other through hinge members which are connected with living hinges to the upper and lower base layers to allow the two base layers to move laterally with respect to each other thereby laterally translating the dome away from a position under the guide mechanism to an adjacent position beneath the keycap.

10. The method of claim 9, wherein said flexible domes are moved from a position under the guide mechanism to a position beneath the keycap.

* * * * *